United States Patent [19]

Seiler

[11] Patent Number: 4,479,095
[45] Date of Patent: Oct. 23, 1984

[54] INTEGRATED CIRCUIT AMPLIFIER FOR LOW INPUT VOLTAGES

[75] Inventor: Hartmut Seiler, Reutlingen, Fed. Rep. of Germany

[73] Assignee: Robert Bosch GmbH, Stuttgart, Fed. Rep. of Germany

[21] Appl. No.: 398,350

[22] Filed: Jul. 15, 1982

[30] Foreign Application Priority Data

Jul. 16, 1981 [DE] Fed. Rep. of Germany ....... 3128028

[51] Int. Cl.$^3$ ............................................. H03F 3/45
[52] U.S. Cl. ..................................... 330/261; 330/252
[58] Field of Search ................. 330/252, 85, 260, 261, 330/257

[56] References Cited

U.S. PATENT DOCUMENTS 3,908,173 9/1975 Murdock ............................ 330/260

Primary Examiner—James B. Mullins
Assistant Examiner—G. Wan
Attorney, Agent, or Firm—Frishauf, Holtz, Goodman & Woodward

[57] ABSTRACT

An amplifier of integrated circuit construction for operating on input voltages less than 10 mV has a signal amplifier which is associated with a regulation loop for regulating out static offset voltages and slow offset voltage drifts. The output of the signal amplifier (1) is connected to the input of a switching amplifier (2) and to the output of a third amplifier (4). At the output of the switching amplifier, which is connected to the input of the third amplifier (4), a capacitor (3) is connected which has its other terminal connected to ground. An output coupling amplifier (5) can aid the switching amplifier (2) in its switching function.

9 Claims, 2 Drawing Figures

INTEGRATED CIRCUIT AMPLIFIER FOR LOW INPUT VOLTAGES

This invention concerns integrated circuit amplifiers utilizing a signal amplifier constituted in the form of a differential amplifier.

Operational amplifiers manufactured as integrated circuits are known in a wide variety of embodiments (see for example the well-known text on semi-conductor circuit technology U. Tietz and CH. Schenk, Halbleiterschaltungstechnik, 4th edition, Springer Verlag, Berlin, Heidelberg and New York, pages 93–121.)

In these known integrated operational amplifiers the typical values for the offset voltage lie at a few millivolts. These operational amplifiers are not usable in the input voltage range from 10 microvolts to 10 millivolts for amplification is often necessary. If such signals are to be processed, chopper-stabilized, amplifiers must be used. These are expensive and are not available as integrated circuit components.

THE INVENTION

It is an object of the invention to provide an integrated circuit amplifier capable of handling input voltages so small that their amplification has heretofore required chopper circuits.

Briefly, the output of the signal amplifier, which is constituted as a differential amplifier is connected with the input of a switching amplifier and to the output of a third amplifier which has its input connected to the output of the switching amplifier, while a capacitor is connected between the output of the switching amplifier and ground. This circuit has the advantage that the regulation loop to which the output of the signal amplifier is connected regulates out the offset voltage. In consequence it is possible to amplify signals from high resistance signal sources which are in the range from 10 microvolts to 10 millivolts. There is also the advantage that the amplifier according to the invention can pass even very low frequencies, for example frequencies smaller than 1 Hz. Furthermore, the amplifier can be readily produced with integrated circuit technology with minimum external circuitry and a low number of contact terminals.

THE DRAWING

The invention is described in more detail by the explanation of illustrative examples with reference to the annexed drawing, in which:

FIG. 1 is circuit block diagram of an embodiment of an amplifier according to the invention, and FIG. 2 is a more detailed circuit diagram of the signal amplifier of the circuit of FIG. 1.

DESCRIPTION OF THE ILLUSTRATED EMBODIMENT

The integrated circuit amplifier of the invention is intended to be capable of operating on the smallest input voltages which are now sought to be amplified, namely those in the region from 0 to 5 millivolts. An application for such an amplifier that is currently of importance is the amplification and evaluation of signals of a strain gauge bridge in an airbag release system in a motor vehicle serving for protection of passengers in the case of accidents.

In the illustrated embodiment of the invention an amplifier of the current amplifier type has been selected that converts an input voltage into an output current. Such an amplifier can be used, according to the termination provided, either as a voltage amplifier—with resistor termination—or as an integrator—with capacitor termination. The transfer characteristic of this amplifier is described by the ratio of output current to input voltage. In contrast to the most often used operational amplifiers, it is possible with current amplifiers to constitute amplifiers of constant or adjustable amplification, and integrators with constant or adjustable integration time, without feedback to the input. In consequence the disadvantages connected with a feedback coupling, such as tendency of the amplifier to oscillate or a low limiting frequency resulting from the measures for suppressing oscillation, as for example the phase characteristic correction of the amplifier, are all avoided.

Figure 1:
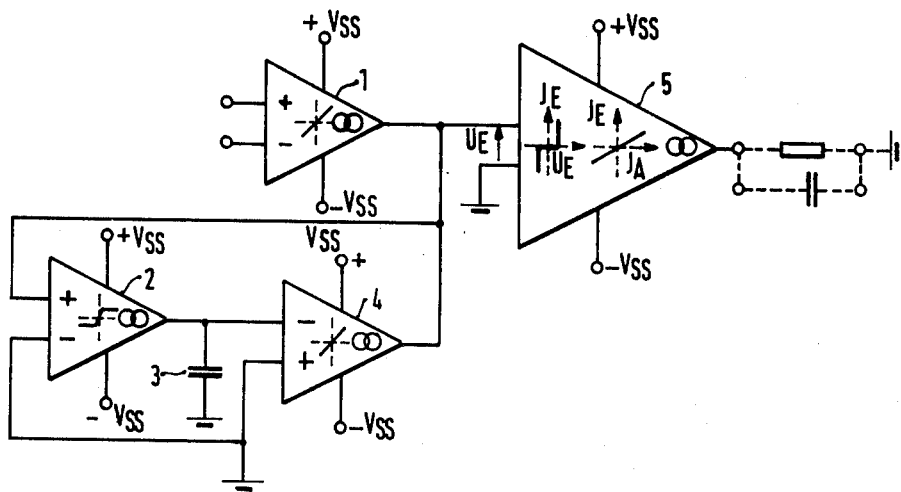

FIG. 1 shows the circuit block diagram of an amplifier according to the invention. There is a signal amplifier 1 having a linear transfer characteristic, i.e. the changes in output current are proportional to changes in input voltage. The signal amplifier 1 is connected with a regulation loop consisting of the switching amplifier 2, the capacitor 3 and the third amplifier 4. The output of the signal amplifier 1 is connected to the non-inverting input of the switching amplifier 2, while the inverting input of the latter is connected to a fixed reference potential, e.g. ground potential. The output of the switching amplifier 2 is connected to one terminal of the capacitor 3 and also to the inverting input of the third amplifier 4, while the other terminal of the capacitor 3 is connected to a fixed reference potential e.g. ground. The non-inverting input of the third amplifier 4 is connected to a fixed reference potential e.g. ground potential and also to the inverting input of the switching amplifier 2. The output of the third amplifier 4 is connected to the output of the signal amplifier 1. Also in FIG. 1 is an output coupling amplifier 5 which provides a useful further development of the amplifier of the invention, but is not absolutely necessary for the functioning of the amplifier of the invention. The output of the signal amplifier 1 is connected to an input of the output coupling amplifier 5, which has its second input connected to the fixed reference potential e.g. ground.

Figure 2:
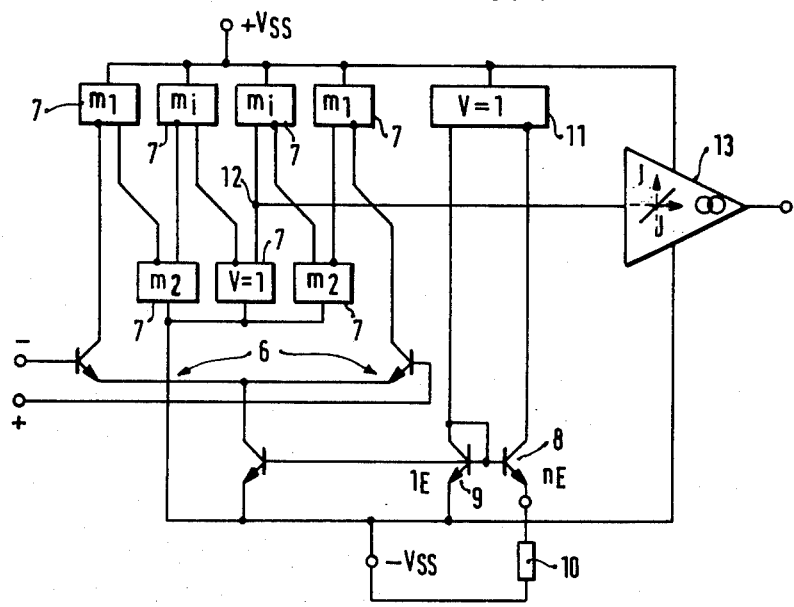

FIG. 2 shows one possibility for constituting the signal amplifier 1 of the circuit of FIG. 1. As shown in FIG. 2 the signal amplifier 1 contains a differential amplifier 6 with upwards acting current mirrors 7 connected respectively in the collector ciruits of the differential amplifier, i.e. on the output side of the differential amplifier. The transformation ratios of the current mirrors are $m_i$, meaning that m is an integer. The input of the current mirror is designated in each case with a dot on its boundary block. By an upwards acting current mirror is meant a current mirror in which the output current is a multiple (in the present case an integral multiple) of the input current. The ratio of input to output current can be adjusted by the ratio of the emitter surfaces of input and output transisters. The steepness of slope of the signal amplifier 1 according to FIG. 2 results from the product of the steepness of the differential amplifier 6

$$S_1 = I/2 \, U_T$$

where $U_T$ is the temperature voltage and I is the current produced by the current source in the emitter branch of the differential amplifier 6, and the amplification factors of the following upwards acting current mirrors m . . . $m_i$, so that $$S = \frac{I}{2 \cdot U_T} \frac{i}{1} m_i.$$

If a current proportional to $U_T$ is produced in the current source lying in the emitter branch of the differential amplifier, the steepness of the amplifier characteristic becomes independent of temperature. By the temperature voltage $U_T$ is meant $$U_T = \frac{kT}{e}:$$

k = Bolzmann constant

T = absolute temperature e = elementary charge

The current source shown in FIG. 2, consisting of the transistors 8 and 9, the resistor 10 and the current mirror 11, is dependent on the temperature voltage $U_T$ as follows:

$$I = \frac{U_T}{R} \ln n$$

Where n is the ratio of the emitter surface of the transistor 8 to the emitter surface of the transistor 9.

The output 12 of the differential amplifiers 6 which is located in the circuit of the following current mirror 7 is connected, in accordance with an advantageous improvement of the invention, with the amplifier 13. The amplifier 13 is not absolutely necessary for constituting the signal amplifier 1, but with it the magnitude of output current change for a given input voltage of the signal amplifier 1 can be increased further without any further amplification of the DC component which is superimposed on the signal current. It makes no sense to transform the current upwards too high by the upwards acting current mirror 7, because technical difficulties arise in the provision of the current mirror if the current through the current mirror is too great. If a high steepness of amplifying characteristic is required from the signal amplifier 1, however, only a moderate steepness is required to be produced by means of the upwards acting current mirror 7 and this steepness is further increased by the amplifier 13. This amplifier 13 should convert an input current proportionally into an output current, i.e. it should have the properties of an upwards acting current mirror, with the difference, however, that both positive and negative currents can be amplified. The amplifier 13 consequently consists essentially of two upwards acting current mirrors of opposed polarity and a suitable bias potential circuit that fixes the potential at the input of the amplifier 13. It is also possible to provide current sources of opposite polarity advantageously in the same manner at the outputs of the other amplifiers of FIG. 1, namely the switching amplifier 2, the third amplifier 4 and the output coupling amplifier 5.

The switching amplifier 2 is constituted as a differential amplifier with a downwards acting current mirror. In a manner analogous to the upward acting current mirror, the ratio of input current to output current in the downwards acting current mirror is determined by the ratio of the emitter currents of the input and output transistors. In the case of a downwards acting current mirror the significant emitter surface of the input transistor is greater than that of the output transistor, so that the output current is smaller than the input current.

The switching amplifier 2 should allow a constant current to flow either out from or into its output independent of the size of the output signal of the signal amplifier 1 and depending only on the polarity of that output. Its linear input region should therefore be as small as possible. Its output current which charges or discharges the capacitor 3 is dimensioned according to the desired regulation time constant of the system. In most cases this curent will be made as small as possible in order to be able to keep down the size of the capacitor as much as possible. It is possible with the present invention to design amplifiers which operate on signals in the region from 10 microvolts to 10 millivolts with a lower frequency limit less than 1 Hz with a capacitor 3 of a $\mu$F and an overall characteristic steepness of $1/10\Omega$.

The third amplifier 4 following the switching amplifier 2 compares the voltage across the capacitor 3 with a reference potential, e.g. ground potential, and delivers at its output a current proportional to this voltage difference. This output current is opposite in phase to the signal current of the signal amplifier 1. To a constant output current of the signal amplifier 1 there is supplemented by the amplifier 4 an opposing current until the sum of the two currents vanishes (i.e. the two currents balance out). The time $T_o$ that elapses until a signal of the signal amplifier 1 is regulated out is proportional to the signal magnitude, to the magnitude of the capacitor 3, to the output current of the switching amplifier 2 and inversely proportional to the steepness of the characteristic of the third amplifier 4. The following relation results:

$$T_o = \frac{C_3 \cdot I_{Out1}}{S_4 \cdot I_{Out2}}$$

Or, with reference to the input voltage of the signal amplifier 1:

$$T_o = U_{In1} \cdot C_3 \cdot \frac{S_1}{S_4} \cdot \frac{1}{I_{Out2}}$$

It is to be recognized that small DC input signals are more quickly regulated out than large DC input signals and that alternating signals with a frequency higher than $1/T_o$ are the less changed, the greater the signal frequency is when compared to $1/T_o$.

In the case of a practical amplifier with the following data:

$$S_1 = \frac{1}{10\Omega}; S_4 = \frac{1}{10k\Omega}; I_{Out2} = 10^{-6}A$$

$$C_3 = 10\mu F, U_{In1} = 100 \mu V$$

The result obtained that $T_o = 1$ sec

The amplifier 4 is likewise a differential amplifier. In order to have available at the capacitor 3 a range of voltage change that is as great as possible, it is necessary to make the linear input range of amplifier 4 as great as possible. This can be done, for example, by inserting negative feedback resistors in the emitter circuit branches of the transistor pair of the differential amplifier.

For coupling out the signal that appears at the output of the signal amplifier 1 it is advantageous to utilize a further special output coupling amplifier 5 of the same type as the amplifier 13. The output coupling amplifier 5 should have the property of passing and proportionally amplifying both positive and negative input currents. In addition, the output coupling amplifier 5 must not interfere in the function of the switching amplifier 2, i.e. on one hand it may not substantially reduce the very high internal resistance of the push-pull current source at the output of the amplifiers 1 and 4 in the neighborhood of the linear input voltage range of the switching amplifier 2 and on the other hand, outside of the linear region of input voltages of the switching amplifier 2 it must limit the voltage at the output of the amplifier 1 according to the polarity of the signals above or below the fixed reference potential with which the inverting input of the switching amplifier 2 is connected, for only thus is a proportional current translation possible from the input of the output coupling amplifier 5 to its output. The output coupling amplifier 5 can be constituted by two current mirrors of opposite polarity that are unbiased or only slightly biased, which operate with reference to the fixed potential with which the inverting input of the switching amplifier 2 and the non-inverting input of the third amplifier 4 are connected.

The manner of operation of the broad band amplifier according to the invention illustrated in FIG. 1 will now be explained more closely.

The static offset voltages and the slow offset voltage drifts (frequency less than $1/T_o$), which are present as the static output signal of the signal amplifier are applied to the input of the switching amplifier 2. This switching amplifier is so constructed that it is overdriven immediately by minimal voltages at its input. It operates like a switch that charges or discharges the capacitor 3 at constant current in accordance with the sign of the signal at its input. The Third amplifier 4 converts the voltage at the capacitor 3 linearly into an output current that is opposed in phase to the output signal of the signal amplifier 1 and that increases until it cancels out the output signal of the signal amplifier 1 (i.e. the output signal vanishes). The output coupling amplifier supports the switching amplifier 2 in its switching function, because when the output signal of the signal amplifier changes polarity the input voltage jumps and the switching amplifier 2 is thus always overdriven. Consequently, inspite of a certain proportional region of the transfer characteristic of the switching amplifier 2 the latter is already overdriven by the smallest signals at the output of the signal amplifier 1.

Although the invention has been described with reference to a particular illustrative example, it will be understood that modifications and variations are possible within the inventive concept.

I claim:

1. Integraged-circuit amplifier for amplifying signal voltages in the lowest voltage range of amplifiable signals, and including a signal amplifier (1) connected as a differential amplifier, and also comprising:
    a switching amplifier (2) having its input connected to the output of said signal amplifier (1);
    a third amplifier (4) having its output connected to the output of said signal amplifier (1) and its input connected to the output of said switching amplifier (2), and
    a capacitor (3) connected between the output of said switching amplifier and a ground connection, whereby said switching amplifier (2), capacitor (3) and third amplifier (4) cooperate to regulate out an offset voltage that would otherwise impair the amplification of small signal voltages by said signal amplifier (1).

2. Amplifier as defined in claim 1, in which said signal amplifier (1) and said third amplifier (4) are amplifiers in which changes in current in the amplifier output circuit are proportional to changes in voltage in the amplifier input circuit.

3. Amplifier as defined in claim 1, in which said switching amplifier is an amplifier that becomes overdriven by signals at its input which are of the smallest magnitude usefully amplifiable by said signal amplifier (1).

4. Amplifier as defined in claim 1, in which said switching amplifier comprises a differential amplifier and downwardly-acting current mirror circuits connected at the output thereof for reducing the output current thereof.

5. Amplifier as defined in claim 1, in which said signal amplifier (1) comprises a differential amplifier (6) and upwards-acting current mirror circuits (7) connected at the output of said differential amplifier (6) for increasing the magnitude of output current change for a given input voltage change in said signal amplifier (1).

6. Amplifier as defined in claim 5, in which a constant current source (8,9,10,11) is provided in the common emitter circuit portion of said differential amplifier (6) in said signal amplifier (1) constituted, so that the current of said constant current source is proportional to the temperature voltage ($U_T$).

7. Amplifier as defined in claim 1, in which said third amplifier (4) is constituted as a differential amplifier having a negative feedback resistance interposed in each of its emitter circuit branches.

8. Amplifier is defined in any one of claims 1–7, in which an output coupling amplifier (5) is connected at the output of said signal amplifier having a characteristic which exhibits an input offset voltage which reverses with changes of input voltage polarity.

9. Amplifier as defined in claim 8, in which push-pull current sources of conventional circuitry are provided at the respective outputs of said signal amplifier (1), said switching amplifier (2), said third amplifier (4) and said output coupling amplifier (5).

* * * * *